(12) United States Patent
Liu

(10) Patent No.: US 10,741,651 B2
(45) Date of Patent: Aug. 11, 2020

(54) IGBT WITH IMPROVED TERMINAL AND MANUFACTURING METHOD THEREOF

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Jian Liu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/892,249

(22) Filed: Feb. 8, 2018

(65) Prior Publication Data
US 2018/0240880 A1    Aug. 23, 2018

(30) Foreign Application Priority Data
Feb. 17, 2017 (CN) .......................... 2017 1 0094873

(51) Int. Cl.
*H01L 29/40* (2006.01)
*H01L 29/739* (2006.01)
(Continued)

(52) U.S. Cl.
CPC ........ *H01L 29/407* (2013.01); *H01L 27/0629* (2013.01); *H01L 27/0658* (2013.01);
(Continued)

(58) Field of Classification Search
CPC ... H01L 28/20; H01L 29/7395; H01L 29/407; H01L 29/405; H01L 29/404;
(Continued)

(56) References Cited

U.S. PATENT DOCUMENTS 7,196,397 B2 * 3/2007 Chiola ................... H01L 27/08
257/531
8,278,682 B2 * 10/2012 Yoshikawa ......... H01L 29/0619
257/133

(Continued)

*Primary Examiner* — Allen L Parker
*Assistant Examiner* — Charles N Ausar-El
(74) *Attorney, Agent, or Firm* — Kilpatrick Townsend & Stockton LLP

(57) ABSTRACT

A terminal structure of an insulated gate bipolar transistor (IGBT) device includes a main junction, a cutoff ring, and a plurality of terminal rings disposed between the main junction and the cutoff ring, and a resistive element having a first terminal electrically connected to the main junction, a second terminal electrically connected to the cutoff ring, and a plurality of intermediate terminals electrically connected to the terminal rings, respectively. The resistive element is configured to uniformly distribute the lateral voltage between the main junction and the cutoff ring to the terminal rings to ensure that the peak electric field is uniformly distributed across the terminal structure, thereby reducing the terminal structure area and package cost of the IGBT device, while improving the device reliability.

17 Claims, 3 Drawing Sheets

(51) Int. Cl.
*H01L 49/02* (2006.01)
*H01L 29/66* (2006.01)
*H01L 27/06* (2006.01)
*H01L 29/06* (2006.01)

(52) U.S. Cl.
CPC .......... *H01L 28/20* (2013.01); *H01L 29/0615* (2013.01); *H01L 29/0619* (2013.01); *H01L 29/404* (2013.01); *H01L 29/66333* (2013.01); *H01L 29/7395* (2013.01); *H01L 29/7397* (2013.01)

(58) Field of Classification Search
CPC ........... H01L 29/66333; H01L 27/0629; H01L 27/0658; H01L 29/7397; H01L 29/0615; H01L 29/0619
See application file for complete search history.

(56) References Cited

U.S. PATENT DOCUMENTS

| | | | |
|---|---|---|---|
| 9,761,675 B1* | 9/2017 | Marinella | H01L 23/291 |
| 2005/0104153 A1* | 5/2005 | Yasuda | H01L 29/7395 |
| | | | 257/477 |
| 2009/0302376 A1* | 12/2009 | Inoue | H01L 29/0619 |
| | | | 257/329 |
| 2014/0118055 A1* | 5/2014 | Seok | H01L 24/06 |
| | | | 327/432 |
| 2016/0064548 A1* | 3/2016 | Laforet | H01L 29/4236 |
| | | | 257/331 |
| 2016/0155794 A1* | 6/2016 | Kim | H01L 29/407 |
| | | | 257/139 |
| 2016/0300904 A1* | 10/2016 | Antoniou | H01L 29/404 |
| 2016/0351657 A1* | 12/2016 | Senoo | H01L 29/404 |
| 2016/0365250 A1* | 12/2016 | Matsui | H01L 21/221 |

* cited by examiner

IGBT WITH IMPROVED TERMINAL AND MANUFACTURING METHOD THEREOF

CROSS-REFERENCES TO RELATED APPLICATIONS

This application claims priority to Chinese patent application No. 201710094873.7, filed on Feb. 17, 2017, the content of which is incorporated herein by reference in its entirety.

FIELD OF THE INVENTION

The present invention relates generally to semiconductor technology. More particularly, embodiments of the present invention relate to a terminal structure of an insulated gate bipolar transistor (IGBT) device, an IGBT device having the terminal structure, and a method of manufacturing the same.

BACKGROUND OF THE INVENTION

An insulated gate bipolar transistor (IGBT) device is a voltage-driven power semiconductor switching device including a bipolar junction transistor (BJT) and an insulated gate field effect transistor (MOSFET). The switching speed of an IGBT device is higher than that of a BJT transistor. Since the IGBT device is a voltage controlled device, it has the advantages of good stability, high input impedance of the MOSFET device and the low conduction voltage drop of the BJT device. Due to the advantages of the low switching losses, simple gate control, excellent switching controllability of the IGBT device, the IGBT device is widely used in the field of power electronics, e.g., in power converters in home appliances, in industrial control, in power transmission system in a vehicle, in energy power grid accesses, etc.

A conventional IGBT device includes a cell region and a terminal structure. The cell region is a function region, and the terminal structure provides the lateral voltage withstand capability of the device.

The terminal structure of the IGBT generally includes a main junction, one or more terminal rings, and a cutoff ring. The main junction is adjacent to the cell region, and the cutoff ring is located at the outermost side of the terminal structure as the terminating end. The one or more terminal rings are located between the main junction and the cutoff ring and include multiple terminal rings, each terminal ring includes a field limit ring and a multi-stage field plate.

In current mainstream terminal ring designs, the terminal rings are floating, the floating field limit rings and the field plate are used to reduce the electric field peak of the main junction to prevent an avalanche breakdown of the cell region and the main junction.

FIG. 1 is cross-sectional view of a conventional IGBT structure including a main junction and IGBT emitter having a same potential, cutoff ring and IGBT collector having a same potential. When a voltage is applied between the electrodes (i.e., between the emitter and the collector) of the IGBT device, the voltage is mainly sustained by the relatively large depth and large width of the main junction. As the applied voltage gradually increases, the depletion layer of the main junction extends outwardly along the main junction toward the terminal rings. The distance between the main junction and the first terminal ring (i.e., ring R1 in FIG. 1) is chosen so that the depletion layer of the main junction passes through the first terminal ring R1 before the avalanche breakdown of the main junction occurs. At this time, the peak electric field close to the main junction is shared by the main junction and the first terminal ring, and the peak electric field close to the main junction is reduced. The continuously increasing voltage is transmitted from the first terminal ring to the second terminal ring (i.e., ring R2 in FIG. 1) until the depletion layer of first terminal ring passes through the second terminal ring, and so on. In this way, the enhanced electric field due to the increasing voltage applied to the electrodes of the IGBT is reduced step by step through the main junction and the terminal rings, preventing the strong electric field strength from causing the avalanche breakdown of the cell region and the main junction.

However, there are inherent design flaws in the floating design of the terminal rings, that is, the peak electric field cannot be evenly distributed between the terminal rings, the maximum electric field peak congregates at the locations of the main junction and the cutoff ring.

FIG. 2 is a graph illustrating the electric field strength distribution taken along the line AA of the terminal structure of the IGBT of FIG. 1 during a normal operation. Since each terminal ring is floating, its potential is completely affected by the electric field strength transmitted by the previous terminal ring or by the main junction, and thus the terminal rings cannot most efficiently share the electric field strength. Therefore, the actual number of terminal rings required to share the electric field strength may exceed the planned number, preventing an efficient reduction of the IGBT package area and an improved reliability of the IGBT device.

Although many solutions have been proposed for adjusting the size and distance of multi-layer field plate and optimizing the structure designs of the multi-layer field plate, they cannot solve the fundamental problems of reducing the IGBT package area, cost, and improving reliability of the IGBT device.

Thus, there is a need to provide a novel IGBT terminal structure and manufacturing method thereof to overcome the above-described problems.

BRIEF SUMMARY OF THE INVENTION

Embodiments of the present invention provide an IGBT terminal structure having improved lateral voltage withstand capability. In general, an IGBT terminal structure is evaluated based on: (1) cost, i.e., a terminal structure is determined to be good when it can satisfy the lateral voltage withstand requirement with the smallest package size; (2) reliability, i.e., a terminal structure is determined to be good when the peak electric field is evenly distributed over the entire terminal structure and not concentrated in a certain location that may cause a charge redistribution and result in a decrease in the device voltage withstand capability and an increase in the device voltage breakdown.

The present invention provides an optimized IGBT terminal structure and a manufacturing method thereof that can solve the above-described problems. In accordance with the present invention, a terminal ring structure has a fixed potential instead of a terminal ring with a floating potential of the prior art. The novel terminal ring structure with a fixed potential can solve the uneven electric field distribution between terminal rings of the prior art while effectively reducing the overall IGBT package area and improving the reliability of the IGBT device by eliminating the disadvantages of the floating terminal ring structure of the prior art.

In one aspect of the present invention, a terminal structure of an insulated gate bipolar transistor (IGBT) device includes a main junction, a cutoff ring, and one or more terminal rings disposed between the main junction and the cutoff ring in a substrate, and a resistive element having a first terminal electrically connected to the main junction, a second terminal electrically connected to the cutoff ring, and one or more intermediate terminals electrically connected to the one or more terminal rings, respectively.

In one embodiment, the resistive element may include a resistance value distribution such that a voltage between the main junction and the cutoff ring is uniformly distributed across the one or more terminal rings.

In one embodiment, the resistive element may include a single resistor having one or more taps such that the voltage between the main junction and the cutoff ring is uniformly distributed across the one or more terminal rings through the one or more taps of the resistive element.

In one embodiment, the resistive element may include one or more resistors connected in series between the main junction and the cutoff ring such that the voltage between the main junction and the cutoff ring is uniformly distributed across the one or more terminal rings through the one or more resistors.

In one embodiment, the resistive element may include a regular shaped resistive material layer such that the voltage between the main junction and the cutoff ring is uniformly distributed across the resistive element when the IGBT device is under normal operating conditions.

In one embodiment, the one or more terminal rings includes a plurality of terminal rings having a same structure, and any two adjacent terminal rings are separated by a same distance.

In one embodiment, the resistive element includes a high resistance value resistor such that a current flowing through the high resistance value resistor is less than a static current of the IGBT device under normal operating conditions.

In one embodiment, the resistive element is disposed outside a package of the IGBT device.

In one embodiment, the resistive element is disposed inside a package of the IGBT device.

Embodiments of the present invention also provide an insulated gate bipolar transistor (IGBT) device that includes the above-described terminal structure.

Embodiments of the present invention also provide a method for manufacturing a terminal structure of an insulated gate bipolar transistor (IGBT) device. The method may include providing a substrate; forming a main junction, one or more terminal rings, and a cutoff ring in the substrate; forming a resistive element; and connecting the resistive element to the main junction, to the one or more terminal rings, and to the cutoff ring through a plurality of electrical connections.

In one embodiment, the method may further include selecting a resistance value distribution of the resistive element such that a voltage between the main junction and the cutoff ring is uniformly distributed across the one or more terminal rings.

In one embodiment, the resistive element includes a resistor, the method further includes adjusting one or more positions of the electrical connections such that the voltage between the main junction and the cutoff ring is uniformly distributed across the one or more terminal rings. In one embodiment, the resistor includes a uniform shaped resistive material layer such that the voltage between the main junction and the cutoff ring is uniformly distributed across the one or more terminal rings through the uniform shaped resistive material layer.

In one embodiment, the resistive element includes a plurality of resistors, and the method further includes adjusting a resistance value of the plurality of resistors such that the voltage between the main junction and the cutoff ring is uniformly distributed across the one or more terminal rings through the plurality of resistors.

In one embodiment, forming the one or more terminal rings includes forming a plurality of terminal rings having a same structure, and any two adjacent terminal rings are separated by a same distance.

In one embodiment, forming the resistive element includes forming a resistive material layer having sufficiently high electrical resistivity so that a current flowing through the resistive material layer is less than a static leakage current of the IGBT device under normal operating conditions.

In one embodiment, the resistive element is disposed outside a package of the IGBT device. In one embodiment, the plurality of electrical connections include bonding wires.

In one embodiment, the resistive element is embedded in a package of the IGBT device, and the plurality of electrical connections comprise metal traces.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1:
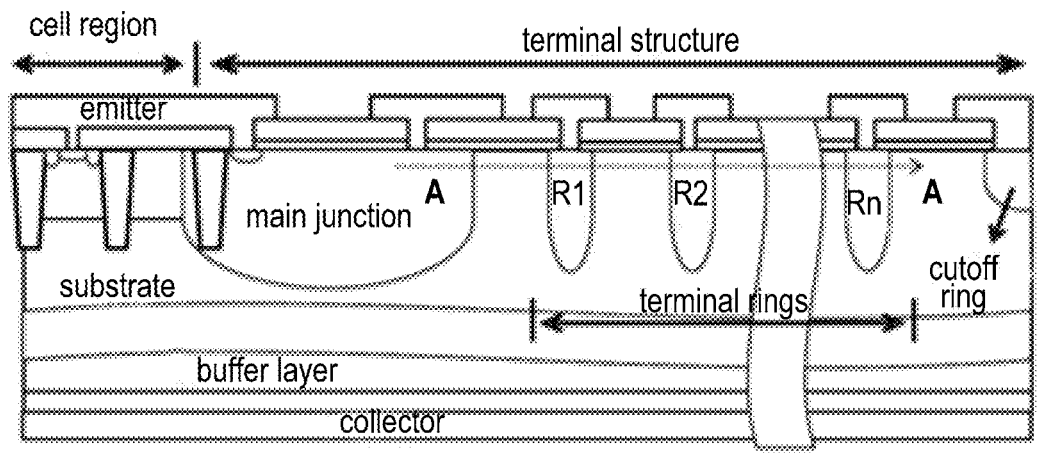
FIG. 1 is cross-sectional view of a conventional IGBT terminal structure including a main junction, terminal rings, and cutoff ring, as known in the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to." or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

Figure 3:
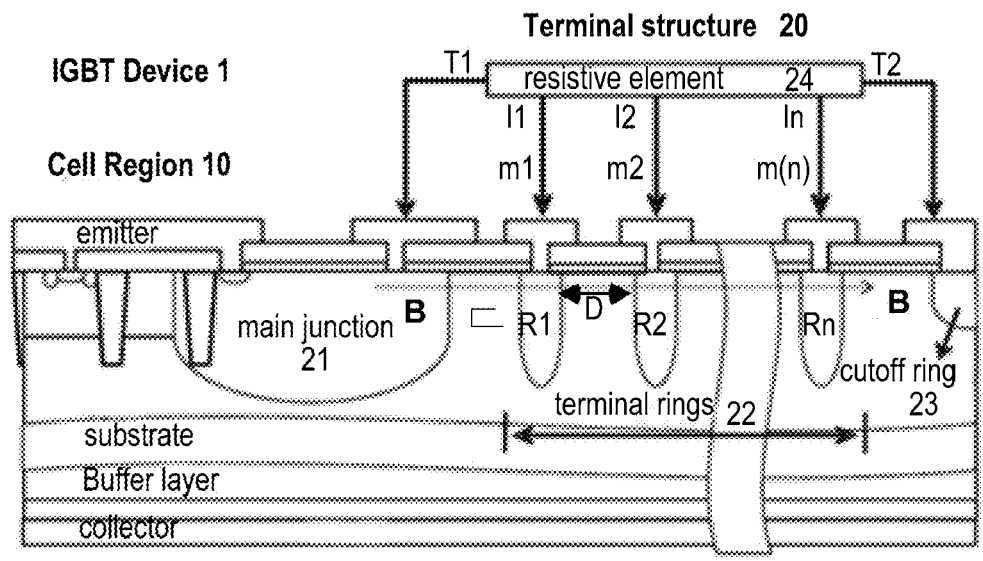
FIG. 3 is cross-sectional view of a structure of an IGBT device according to an embodiment of the present invention.

FIG. 3 is cross-sectional view of a structure of an IGBT device 1 according to an embodiment of the present invention. IGBT device 1 may include a cell region 10 and a terminal structure 20. Terminal structure 20 includes a main junction 21, one or more terminal rings 22 (i.e., ring R1, ring R2, . . . , ring Rn), and a cutoff ring 23. Of course, those of skill in the art will appreciate that the one or more terminal rings 22 may include only one terminal ring. Terminal rings 22 may be circles, ovals, or rectangles (e.g., squares) with rounded corners.

Referring to FIG. 3, terminal structure 20 also includes a resistive element 24 electrically connected to main junction 21, terminal rings 22, and cutoff ring 23. Resistive element 24 may have a certain resistance value distribution such that the voltage between the main junction and the cutoff ring is evenly distributed over the terminal rings.

Resistive element 24 may be a single resistor having a plurality of intermediate taps (I1, I2, . . . , In) that electrically connect to the respective terminal rings of the terminal structure via a plurality of metal connections, e.g., metal traces (i.e., metal wires (m1, m2, . . . , m(n)), or electrical contacts, as shown in FIG. 3. In particular, both terminal ends (T1, T2) of resistive element 24 each are connected to the main junction and the cutoff ring, respectively. Each of the terminal rings is connected to a different tap (I1, I2, . . . , In) of resistive element 24.

In normal operating conditions of the IGBT device, the voltage across the resistive element is the difference between the potential of the emitter terminal of the IGBT device (i.e., the potential of the main junction) and the potential of the collector terminal (i.e., the potential of the cutoff ring), and the potential of each terminal ring is determined by the potential at the corresponding position connected to the resistive element, i.e., the respective terminal rings in FIG. 3 each have a fixed potential.

The resistive element is configured to operate as a voltage divider, i.e., by adjusting the position of the terminal rings connected to the resistive element, or by adjusting the taps of the resistive element, the voltage between the main junction and cutoff ring can be evenly distributed across the terminal rings.

In one embodiment, in order to facilitate the ease of adjusting the positions of the connections, the resistive element has a uniform structure so that the voltage between the main junction and the cutoff ring is evenly distributed on the resistive element when the IGBT device is under normal operating conditions. In one embodiment, the resistive element may have an elongated bar shape, in which the potential at each position on the resistive element only depends on the distance between the two terminal ends (T1, T2) of the resistive element. In this way, the potential of the respective terminal rings can be easily adjusted in accordance with the position of the respective terminal rings connected to the resistive element. In one embodiment, the resistive element may include a regular shaped resistive material layer having a relatively high resistivity. For example, the resistivity is greater than $10^5$ Ω-cm. The resistive material layer may be formed integrally in the terminal structure using a deposition process.

The terminal structure of the present invention is very simple to be implemented. For example, the terminal rings each may have the same structure, and any two adjacent terminal rings have an equal distance. This approach will avoid the very complex design of the terminal structure in the prior art that requires an adjustment the opening size of the terminal rings, the main junction depth and width, and spacing between the terminal rings, and the structure of the multi-layer field plate design, etc.

The use of terminal rings having the same structure and equal spacing (distance) between them enable an easy adjustment of the potential of each terminal ring. That is, two neighboring terminal rings R1 and R2, R2 and R3, ..., R(n−1) and Rn each are separated by a same spacer region (denoted "D" in FIG. 3). For example, assuming that the potential difference between the main junction and the cutoff ring is U, the number (n) of terminal rings having the same structure and separated from each other by an equal distance are used. By connecting the terminal rings to the respective n intermediate taps of the regular shaped (e.g., elongated bar-shape) resistive element, the potential difference between ring R1 and main junction, between adjacent rings, and between ring Rn and the cutoff ring is U/(n+1). Therefore, it is possible to adjust the positions of the terminal rings to the resistive element by considering the number of terminal rings so that the a uniform electric field distribution of the terminal structure region can be easily achieved when the IGBT is under normal operating conditions. The terminal structure of the present invention is very simple to implement compared with prior art approaches.

When selecting the resistive element, it is important to consider whether the introduction of an additional resistor in the IGBT structure may result in a significant increase in power consumption of the IGBT device. The additional power consumption can be avoided by selecting a high resistance value resistor. When a resistor with a sufficiently high resistance is selected, the current flowing through the resistor is less than the static leakage current of the IGBT device during normal operating conditions of the IGBT device.

Figure 4:
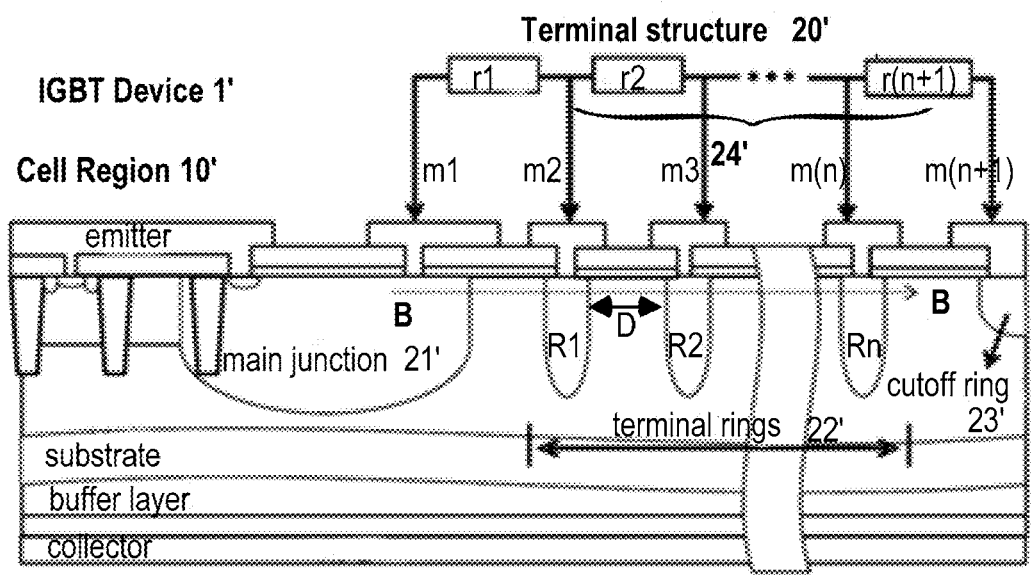
FIG. 4 is cross-sectional view of a structure of an IGBT device according to another embodiment of the present invention.

FIG. 4 is a cross-sectional view of a structure of an IGBT device 1' according to another embodiment of the present invention. The structure of IGBT device 1' is similar to that of FIG. 3 with the difference in the resistive element. Referring to FIG. 4, IGBT device 1' includes a terminal structure 20' having a resistive element 24'. Resistive element 24' includes a plurality of resistors r1, r2, ..., r(n+1).

Referring to FIG. 4, resistors r1, r2, ..., r(n+1) are connected in series between main junction 21' and cutoff ring 23'. For example, first resistor r1 is connected between main junction 21' and first terminal ring R1 through respective metal connections m1 and m2, second resistor r2 is connected between first terminal ring R1 and second terminal ring R2, and last resistor r(n+1) is connected between last terminal ring Rn and cutoff ring 23' through respective metal connection m(n) and m(n+1). During normal operating conditions of the IGBT device, the voltage between the main junction and the cutoff ring is shared by the (n+1) resistors, and the potentials of the respective terminal rings are determined by the resistance values of the resistors to which they are connected to, i.e., the terminal rings in FIG. 4 each are at a fixed potential.

By adjusting the resistance value of the connected corresponding resistor, it is possible to uniformly distribute the voltage between the main junction and the cutoff ring to the plurality of the terminal rings.

The resistive element is selected with a sufficiently high resistance value so that the current flowing through the resistive element is less than the static leakage current of the IGBT device during the normal operation, to prevent a significant increase in power consumption introduced by the resistive element.

Similarly to the structure in FIG. 3, each of the terminal rings in FIG. 4 can be a simple structural design. For example, the terminal rings each may have the same structure, and any two adjacent terminal rings have an equal spacing (i.e., they are separated from each other by a same spacer region denoted "D" in FIG. 4) in order to easily adjust the potential of each potential ring.

For example, assuming that the potential difference between the main junction and the cutoff ring is U, a number (n) of terminal rings having the same structure and disposed at an equal spacing are used, where n is a positive integer greater than 2. By connecting the n terminal rings to the respective (n+1) resistors, i.e., resistor r1 is connected between main junction 21' and ring R1, resistor r2 is connected between ring R1 and ring R2, resistor r(n) is connected between ring (n−1) and ring Rn. and resistor r(n+1) is connected between ring Rn and offset ring 23', the potential difference between any two adjacent rings is U/(n+1). Therefore, a uniform electric field distribution of the terminal structure region can be easily achieved when the IGBT is in normal operation.

Figure 5:
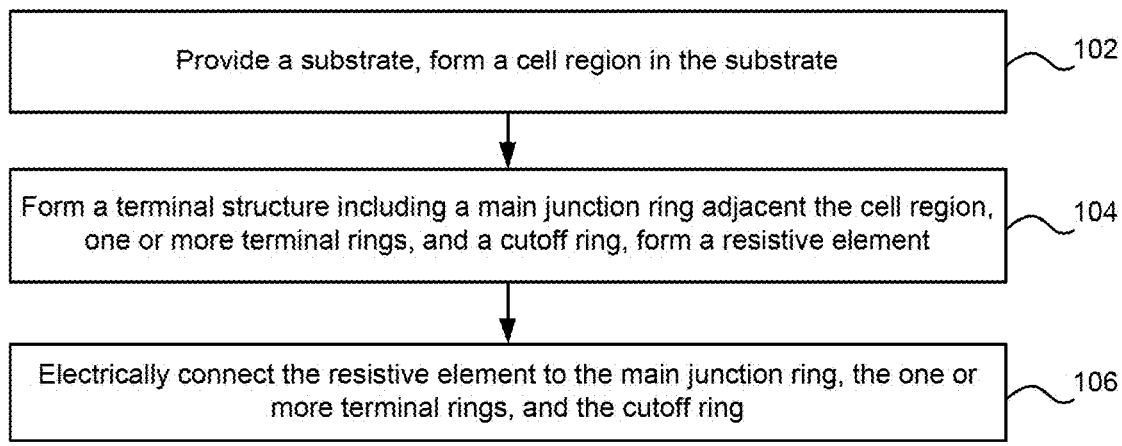
FIG. 5 is a simplified flowchart illustrating a method of manufacturing an IGBT device according to an embodiment of the present invention.

FIG. 5 is a simplified flowchart illustrating a method for manufacturing an IGBT device according to an embodiment of the present invention. As shown in FIG. 5, the method includes the following steps:

Step 102: forming a cell region in a substrate.

Step 104: forming a terminal structure adjacent the cell region. In one embodiment, forming the terminal structure includes forming a main junction, one or more terminal rings, and a cutoff ring in the substrate. In on embodiment, forming the terminal structure also includes forming a resistive element having a first terminal end, a second terminal end, and one or more intermediate taps disposed between the first and second terminal ends, the resistive element may be formed by depositing a high resistivity material layer on the main junction, the one or more terminal rings and cutoff ring. In another embodiment, forming the terminal structure also includes forming a resistive element having a plurality of resistors having a same resistance value, the resistors are connected in series.

Step 106: electrically connecting the resistive element to the main junction, the one or more terminal rings, and the cutoff ring. In one embodiment, the first terminal of the resistive element is electrically connected to the main junction, and the second terminal of the resistive element is electrically connected to the cutoff ring.

In one embodiment, the resistive element is a single resistor having one or more intermediate taps. In this embodiment, step 106 also includes connecting the one or more terminal rings to the one or more intermediate taps of the resistive element, such that the voltage applied between the main junction and the cutoff ring is uniformly distributed over the one or more terminal rings. In one embodiment, the resistive element has a regular shape (e.g., an elongated bar) of a resistive material layer, so that the voltage between the main junction and the cutoff ring is uniformly distributed over the resistive element during a normal operation of the IGBT device.

In one embodiment, the resistive element includes a plurality of resistors connected in series between the main junction and the cutoff ring. The terminal structure includes a plurality of terminal rings disposed between the main junction and the cutoff ring. In this embodiment, step 106 also includes connecting each of the plurality of terminal rings to one of the plurality of resistors. Step 106 also includes adjusting the resistance value of the resistors so that the voltage between the main junction and the cutoff ring is uniformly distributed to the terminal rings.

In one embodiment, the resistance value of the resistive element is selected to be sufficient high such that the current flowing through the resistive element is lower than the static leakage current of the IGBT device in normal operation condition to prevent a significant increase in power consumption of the IGBT structure due to the addition of the resistive element to the IGBT structure.

In one embodiment, the terminal rings each have the same structure, and any two neighboring (adjacent) terminal rings are separated by the same spacer region (distance) in order to facilitate an easy potential adjustment of each terminal ring.

The resistive element of the present invention may be implemented in a variety of ways. In one embodiment, the resistive element may include conventional resistors that are commercially available and provided external to the IGBT device and connected to the terminal rings through respective metal connections, e.g., metal wires or bond wires. In another embodiment, the resistive element may be formed integrally with the IGBT device (e.g., using a lithography and etching process) and connected through metal wire connections at appropriate locations of the terminal structure.

Figure 2:
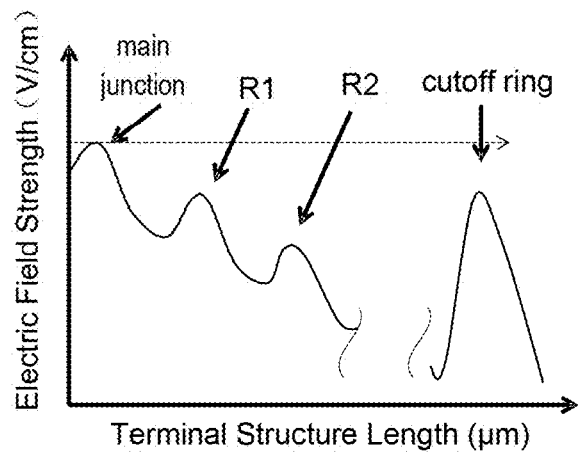
FIG. 2 is a graph illustrating the electric field strength distribution taken along the line AA of the terminal structure of the IGBT device of FIG. 1 during normal operating conditions, as known in the prior art.
Figure 6:
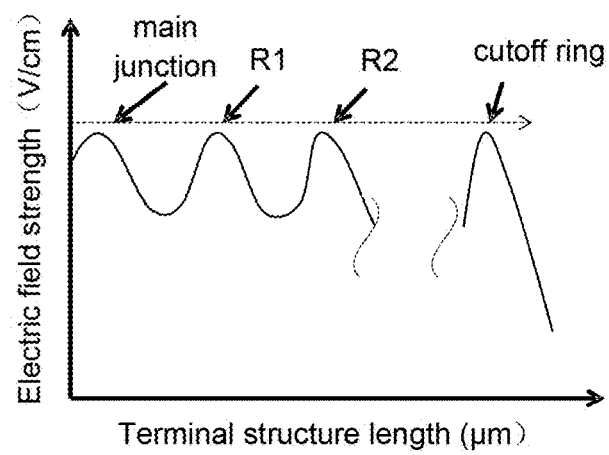
FIG. 6 is a graph illustrating the electric field distribution of an IGBT device during normal operation according to an embodiment of the present invention.

FIG. 6 is a graph illustrating the electric field distribution of the terminal structure of an IGBT device of FIG. 3 or FIG. 4 taken along the line BB during the IGBT device normal operation according to an embodiment of the present invention. As is clearly shown in FIG. 6, the electric field strength of the respective portions (main junction, terminal rings, and cutoff ring having substantially the same electric field strength) of the terminal structure of the IGBT device is uniformly distributed as compared with the electric field intensity distribution shown in FIG. 2 of the prior art.

Compared with the floating design approach of the conventional terminal structure, the potential of the respective terminal rings in the terminal structure of the IGBT device of the present invention is fixed and does not depend on the electric field transfer, so that each terminal ring can withstand high electric field strengths and be more capable to share the electric field strengths to increase the IGBT device breakdown voltage. Since the maximum lateral voltage that an IGBT terminal structure can withstand is equal to the integral of electric field strength and the lateral length of the terminal structure, therefore, in the case of where the maximum lateral voltage in an IGBT terminal structure is fixed, the number of terminal rings required for the IGBT structure of the present invention is smaller than the number of terminal rings required in the prior art approach, thereby effectively reducing the overall area of the IGBT device package, and at the same time improving the IGBT device reliability.

The terminal structure of an IGBT device and the manufacturing method thereof have been described in detail according to some embodiments of the present invention.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A terminal structure of an insulated gate bipolar transistor (IGBT) device, comprising:
    a main junction, a cutoff ring, and a plurality of terminal rings each having a same structure and disposed between the main junction and the cutoff ring in a substrate, wherein any two adjacent terminal rings are separated by a same spacer region; and
    a resistive element having a first terminal electrically connected to the main junction, a second terminal electrically connected to the cutoff ring, and a plurality of intermediate terminals each electrically connected to one of the terminal rings, wherein the resistive element comprises an elongated bar shape, and the intermediate terminals are separated from each other by an equal distance.

2. The terminal structure of claim 1, wherein the resistive element comprises a resistance value distribution such that a voltage between the main junction and the cutoff ring is uniformly distributed across the terminal rings.

3. The terminal structure of claim 2, wherein the resistive element comprises a single resistor having one or more taps such that the voltage between the main junction and the cutoff ring is uniformly distributed across the terminal rings by a corresponding tap of the one or more taps of the resistive element.

4. The terminal structure of claim 2, wherein the resistive element comprises a plurality of resistors having a same resistance value and connected in series between the main junction and the cutoff ring such that the voltage between the main junction and the cutoff ring is uniformly distributed across the terminal rings by a corresponding resistor.

5. The terminal structure of claim 2, wherein the resistive element comprises a regular shaped resistive material layer such that the voltage between the main junction and the cutoff ring is uniformly distributed across the resistive element when the IGBT device is under normal operating conditions.

6. The terminal structure of claim 1, wherein the resistive element comprises a high resistance value resistor such that a current flowing through the high resistance value resistor is less than a static current of the IGBT device under normal operating conditions.

7. The terminal structure of claim 1, wherein the resistive element is disposed outside a package of the IGBT device.

8. The terminal structure of claim 1, wherein the resistive element is disposed inside a package of the IGBT device.

9. An insulated gate bipolar transistor (IGBT) device comprising a terminal structure of claim 1.

10. A terminal structure of an insulated gate bipolar transistor (IGBT) device, comprising:
   a main junction, a cutoff ring, and a plurality of terminal rings each having a same structure and disposed between the main junction and the cutoff ring in a substrate, wherein any two adjacent terminal rings are separated by a same spacer region; and
   a resistive element having a first terminal electrically connected to the main junction, a second terminal electrically connected to the cutoff ring, and a plurality of intermediate terminals each electrically connected to one of the terminal rings, wherein the resistive element comprises a regular shaped resistive material layer having a resistivity greater than $10^5$ $\Omega\text{-}cm$.

11. The terminal structure of claim 10, wherein the resistive element comprises a resistance value distribution such that a voltage between the main junction and the cutoff ring is uniformly distributed across the terminal rings.

12. The terminal structure of claim 10, wherein the resistive element comprises a single resistor having one or more taps such that a voltage between the main junction and the cutoff ring is uniformly distributed across the terminal rings by a corresponding tap of the one or more taps of the resistive element.

13. The terminal structure of claim 10, wherein the resistive element comprises a plurality of resistors having a same resistance value and connected in series between the main junction and the cutoff ring such that a voltage between the main junction and the cutoff ring is uniformly distributed across the terminal rings by a corresponding resistor.

14. The terminal structure of claim 10, wherein the regular shaped resistive material layer is configured such that a voltage between the main junction and the cutoff ring is uniformly distributed across the resistive element when the IGBT device is under normal operating conditions.

15. The terminal structure of claim 10, wherein the resistive element comprises a high resistance value resistor such that a current flowing through the high resistance value resistor is less than a static current of the IGBT device under normal operating conditions.

16. The terminal structure of claim 10, wherein the resistive element is disposed outside a package of the IGBT device.

17. The terminal structure of claim 10, wherein the resistive element is disposed inside a package of the IGBT device.

* * * * *